(12) United States Patent
Ramirez et al.

(10) Patent No.: US 10,900,916 B2
(45) Date of Patent: Jan. 26, 2021

(54) METHOD AND APPARATUS TO DETECT FREE INDUCTION DECAY NMR SIGNALS

(71) Applicants: Marc Stephen Ramirez, Missouri City, TX (US); Quming Zhou, Houston, TX (US)

(72) Inventors: Marc Stephen Ramirez, Missouri City, TX (US); Quming Zhou, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 270 days.

(21) Appl. No.: 16/036,342

(22) Filed: Jul. 16, 2018

(65) Prior Publication Data

US 2020/0018148 A1 Jan. 16, 2020

(51) Int. Cl.
*E21B 47/00* (2012.01)
*G01V 3/32* (2006.01)
(Continued)

(52) U.S. Cl.
CPC .............. *G01N 24/081* (2013.01); *E21B 7/04* (2013.01); *E21B 29/00* (2013.01); *E21B 33/12* (2013.01);
(Continued)

(58) Field of Classification Search
CPC .......... E21B 29/00; E21B 33/12; E21B 43/26; E21B 47/00; E21B 47/13; E21B 7/04;
(Continued)

(56) References Cited

U.S. PATENT DOCUMENTS 6,005,389 A 12/1999 Prammer
6,177,794 B1 1/2001 Stoeffl
(Continued)

FOREIGN PATENT DOCUMENTS

WO 20170100000 A2 6/2017

OTHER PUBLICATIONS

International Search Report and Written Opinion for International Application No. PCT/US2019/041299; Date of Completion: Nov. 4, 2019; dated Nov. 5, 2019; 9 Pages.
(Continued)

*Primary Examiner* — Rishi R Patel
(74) *Attorney, Agent, or Firm* — Cantor Colburn LLP

(57) ABSTRACT

A method for transforming an earth formation and/or a completion component for the earth formation based on estimating a parameter of the earth formation includes: performing a nuclear magnetic resonance (NMR) experiment on the earth formation, the NMR experiment includes transmitting an initial radio-frequency (RF) pulse and a series of refocusing RF pulses; detecting a truncated free induction decay (FID) signal following the initial RF pulse and a spin echo following at least one refocusing RF pulse, the truncated FID signal missing an initial part of a total FID signal; reconstructing the total FID signal using the truncated FID signal, the detected spin echo, and a calculated or measured time between end of transmitting the initial RF pulse and beginning of receiving the truncated FID signal; estimating the parameter using the total FID signal; and transforming the earth formation and/or the completion component based on the estimated property using transformation-equipment.

23 Claims, 4 Drawing Sheets

(51) Int. Cl.
*G01V 3/38* (2006.01)
*G01N 15/08* (2006.01)
*E21B 7/04* (2006.01)
*E21B 43/26* (2006.01)
*E21B 29/00* (2006.01)
*E21B 33/12* (2006.01)
*E21B 47/12* (2012.01)
*G01N 24/08* (2006.01)
*E21B 47/13* (2012.01)

(52) U.S. Cl.
CPC ............. *E21B 43/26* (2013.01); *E21B 47/00* (2013.01); *E21B 47/13* (2020.05); *G01N 15/088* (2013.01); *G01V 3/32* (2013.01); *G01V 3/38* (2013.01)

(58) Field of Classification Search
CPC .... G01N 15/088; G01N 24/081; G01N 33/24; G01R 33/44; G01R 33/445; G01R 33/3808; G01V 3/32; G01V 3/38
See application file for complete search history.

(56) References Cited

U.S. PATENT DOCUMENTS

| | | | |
|---|---|---|---|
| 6,366,086 B1 | 4/2002 | Sen | |
| 6,466,013 B1 | 10/2002 | Hawkes et al. | |
| 6,559,640 B2 | 5/2003 | Taicher | |
| 6,618,322 B1 | 9/2003 | Georgi | |
| 6,900,630 B2 | 5/2005 | Edwards | |
| 7,015,694 B2 | 3/2006 | Bluemich | |
| 7,180,287 B2 | 2/2007 | Rottengatter et al. | |
| 7,564,240 B2 | 7/2009 | Ganesan | |
| 2003/0016013 A1* | 1/2003 | Kruspe | G01R 33/50 324/303 |
| 2003/0094281 A1* | 5/2003 | Tubel | E21B 47/135 166/250.03 |
| 2013/0105179 A1* | 5/2013 | Lieberman | E21B 43/006 166/402 |
| 2015/0022202 A1 | 1/2015 | Song et al. | |
| 2015/0145513 A1 | 5/2015 | Li et al. | |
| 2015/0153432 A1 | 6/2015 | James et al. | |
| 2015/0253454 A1 | 9/2015 | Song et al. | |
| 2016/0077183 A1 | 3/2016 | Jachmann et al. | |
| 2016/0109613 A1* | 4/2016 | Paulsen | G01V 3/32 324/303 |
| 2016/0116629 A1 | 4/2016 | Radu et al. | |
| 2016/0274204 A1 | 9/2016 | Song et al. | |
| 2017/0176627 A1* | 6/2017 | Venkataramanan | G01V 3/32 |
| 2017/0212063 A1 | 7/2017 | Kantzas et al. | |
| 2017/0322338 A1 | 11/2017 | Song et al. | |
| 2018/0202288 A1* | 7/2018 | Elbadawy | F24T 10/17 |

OTHER PUBLICATIONS

Behroozmand, et al., "A Review of the Principles and Applications of the NMR Technique for Near-Surface Characterization"; Surveys in Geophysics, Jan. 2015, vol. 36, Issue 1; Abstract only.

Chen et al., "The internal magnetic field distribution, and single exponential magnetic resonance free induction decay, in rocks"; Journal of Magnetic Resonance, vol. 175, Issue 2, Aug. 2005, Abstract only.

Li; "Spin Echo SPI Methods for Quantitative Analysis of Fluids in Porous Media"; Abstract; Journal of Magnetic Resonance; ScienceDirect; Jun. 2009.

* cited by examiner

METHOD AND APPARATUS TO DETECT FREE INDUCTION DECAY NMR SIGNALS

BACKGROUND

Geologic formations may be used for many applications such as hydrocarbon production, geothermal production, and carbon dioxide sequestration. Typically, boreholes are drilled into the formations to access them. Various downhole tools or instruments may be conveyed in the boreholes in order to characterize the formations. Characterization of the formations and the fluids within provides valuable information related to the intended use of the formations so that drilling and production resources can be used efficiently.

One type of downhole instrument is a nuclear magnetic resonance (NMR) tool that measures nuclear magnetic properties of formation materials such as fluids within a rock matrix. From the measured magnetic properties, a formation property such as porosity can be estimated. Hence, innovations that improve the accuracy of measuring a magnetic property using NMR signals would be well received in the drilling and production industries.

SUMMARY

Disclosed is a method for transforming at least one of an earth formation and a completion component for the earth formation based on estimating a parameter of the earth formation. The method includes: conveying a carrier through a borehole penetrating the earth formation; performing a nuclear magnetic resonance (NMR) experiment on the earth formation using an NMR tool disposed on the carrier, the NMR experiment includes transmitting an initial radio-frequency (RF) pulse and a series of refocusing RF pulses; detecting a truncated free induction decay (FID) signal following the initial RF pulse and a spin echo following at least one refocusing RF pulse using the NMR tool, the truncated FID signal missing an initial part of a total FID signal; reconstructing with a processor the total FID signal using the truncated FID signal, one or more of the detected spin echoes, and a calculated or measured time between end of transmitting the initial RF pulse and beginning of receiving the truncated FID signal; estimating with the processor the parameter using the total FID signal; and transforming at least one of the earth formation and the completion component based on the estimated property using transformation-equipment.

Also disclosed is an apparatus for transforming at least one of an earth formation and a completion component for the earth formation based on estimating a parameter of the earth formation. The apparatus includes: a nuclear magnetic resonance (NMR) tool configured to perform a nuclear magnetic resonance (NMR) experiment on the formation, the NMR experiment includes (a) transmitting an initial radio-frequency (RF) pulse and a series of refocusing RF pulses and (b) detecting a truncated free induction decay (FID) signal following the initial RF pulse and one or more spin echoes following at least one refocusing RF pulse, the truncated FID signal missing an initial part of a total FID signal; a processor configured to reconstruct the total FID signal using the truncated FID signal, one or more of the detected spin echoes, and a measured or estimated time between end of transmitting the initial RF pulse and beginning of receiving the truncated FID signal and to estimate the parameter using the total FID signal; and transformation-equipment configured to transform at least one of the earth formation and the completion component for the earth formation based on the estimated parameter.

BRIEF DESCRIPTION OF THE DRAWINGS

The following descriptions should not be considered limiting in any way. With reference to the accompanying drawings, like elements are numbered alike.

DETAILED DESCRIPTION

Figures 1A, 1B, 1C:
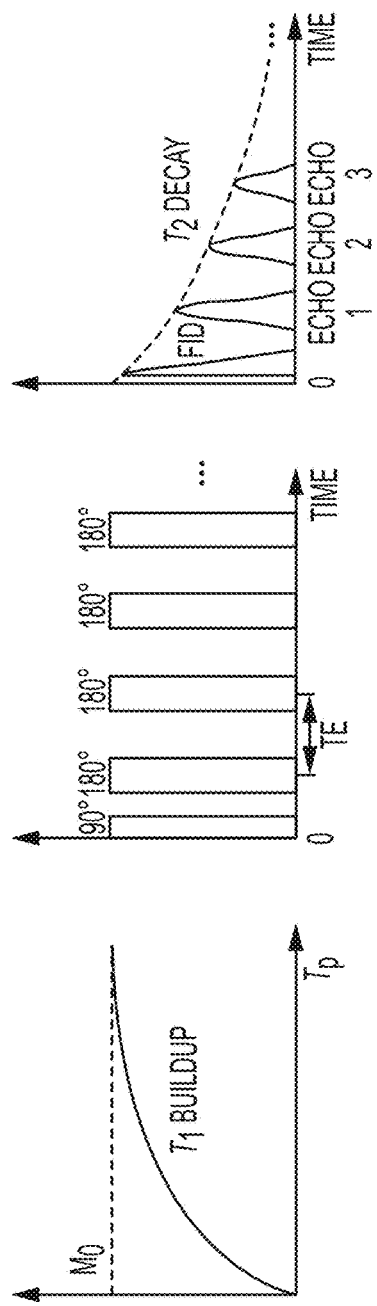
FIGS. 1A-IC, collectively referred to as FIG. 1, depict aspects of a polarization period, a radio-frequency (RF) pulse sequence, and corresponding spin echoes.

A detailed description of one or more embodiments of the disclosed apparatus and method are presented herein by way of exemplification and not limitation with reference to the Figures.

Disclosed are methods and apparatuses for estimating a parameter of a formation and performing a physical operation on the formation based on the estimated parameter. The parameter is estimated using a nuclear magnetic resonance (NMR) tool that transmits radio-frequency (RF) pulses that include refocusing RF pulses and receives a truncated free induction-decay (FID) signal after the first pulse and spin echoes after the refocusing pulses. Due to the physics of NMR experiments in an inhomogeneous magnetic field, the FID signal has a rapid decay rate. Despite efforts to speed up acquisition times with modern electronics, the total FID signal is truncated with an initial part of the FID signal missing in a region referred to as "dead time." Because the total FID signal is needed to estimate the parameter, the parameter may not be estimated accurately using only the truncated FID signal, causing unwanted uncertainties in the parameter estimation. The disclosed methods and apparatuses teach reconstructing the total FID signal using data, such as shapes, derived from the spin echoes, which are for the most part completely captured. With the total FID signal reconstructed, the parameter of interest, such as porosity, can be more accurately estimated. The physical operation can then be performed on the formation using the more accurate parameter to more efficiently use exploration and production resources.

Methods and apparatuses presented herein are configured to accurately estimate FID signals in NMR well-logging instruments. The maximum amplitude of the FID signal is an indicator of formation porosity. Conventional NMR measurements do not measure the FID signal due to the low signal-to-noise ratio and ring-down time associated with the detector, particularly in inhomogenous magnetic fields, such as those involved with multi-frequency well logging.

A pitch-and-catch configuration (i.e., separate transmitter and receiver sections) is used to excite the formation with a high-power pulse transmitter and detect the resulting FID signal. The pitch-and-catch configuration uses a receiver coil that is separate from a transmitter coil resulting in reduced dead time, and improved signal-to-noise ratio of the FID signal. The tail end of the FID signal can be detected with a higher confidence. The porosity can therefore be more accurately estimated by using both the FID signal and spin echoes rather than the spin echoes alone. Automatic gain control (AGC) in the receiver is introduced to attenuate the otherwise out-of-range FID signal. The detection window is enabled as long as the FID signal does not saturate the receiver. The shape of the acquired FID signal is compared with a template built from the successive echo signals and provides an accurate measurement of the FID amplitude window, with just a small sampling of the FID signal tail being required. This allows a more accurate estimate of porosity than what is offered by conventional state of the art NMR logging tools that acquire NMR spin echoes only and estimate the initial FID amplitude (i.e. to measure porosity) with great uncertainty.

Disclosed NMR logging instruments use static and pulsed radio frequency (RF) magnetic fields to create downhole pulse-echo magnetic resonance measurements. The measurement in general includes two steps. The first step is to use a static magnetic field $B_0$ to polarize the otherwise randomly oriented hydrogen nuclei in the reservoir fluids. During polarization, the magnetization grows exponentially with a time constant $T_1$ towards its equilibrium value, $M_0$ (see FIG. 1A). Immediately after adequate magnetization is achieved, a train of RF magnetic pulses, such as in the Carr-Purcell-Meiboom-Gill (CPMG) sequence, is applied to the formation. The first RF pulse is called an excitation pulse because it rotates the magnetization vector to be perpendicular to $B_0$, in the transverse plane. The excitation pulse is then followed by a series of refocusing pulses that are used to form coherent spin-echo signals (see FIG. 1B). The spin echoes are recorded between each pair of refocusing pulses (see FIG. 1C). Most often, excitation pulses are achieved by a 90° rotation of the net magnetization, whereas excitation pulses are achieved with a 180° pulse.

An NMR FID signal occurs immediately after the excitation pulse and is typically not sampled in conventional NMR logging instruments due to the rapid dephasing associated with inhomogeneous magnetic fields, with stronger static field gradients producing more rapid dephasing. The initial maximum amplitude of the FID signal is related to the volume of fluid in the formation and is used to estimate formation porosity based on a standard laboratory reference measurement. However, the total FID signal is quite difficult to detect due to its short duration and the low signal-to-noise ratio. As a result, samples of the $T_2$ decay rate in conventional methods and apparatuses are used to extrapolate the signal at $t=0^+$ (i.e. the moment immediately after the excitation pulse). Unfortunately, there is great uncertainty in the extrapolation, including unwanted ringing effects that may limit the usefulness of the initial echo, thus presenting large uncertainties in the porosity log.

The amplitude of the spin-echo train at time t, which is the amplitude of the transverse magnetization $M_{xy}(t)$, is given by $$M_{xy}(t) = M_{0xy} e^{\frac{-t}{T_2}}$$

where $M_{0xy}$ is the magnitude of the transverse magnetization at $t=0^+$, the time at which the excitation pulse ceases. $M_{0xy}$ is directly proportional to the number of polarized hydrogen nuclei in the pore fluid. Porosity is provided from the raw data by taking the ratio of this amplitude to the tool response in a water tank (which is a medium with 100% porosity).

Figure 2:
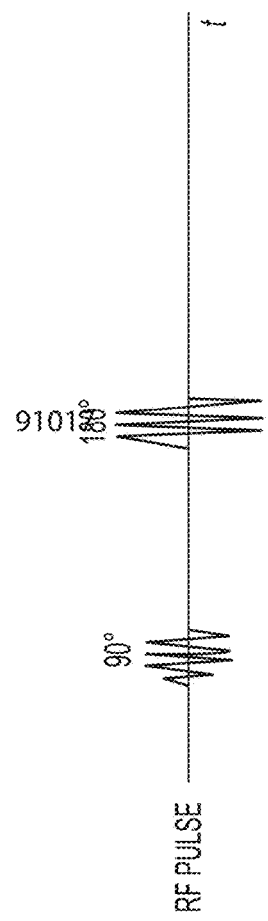
FIG. 2 depicts aspects of a 90° excitation RF pulse and 180° refocusing RF pulse and corresponding free induction decay (FID) and spin echo signals.

The FID signal is caused by magnetic-field inhomogeneities that are due to the magnetic field gradient and to certain molecular processes that occur in the measured material. Because of the inhomogeneities in the $B_0$ field, protons at different locations will be processed with different Larmor frequencies, thereby producing this very rapid decay. It is quite difficult to measure the initial amplitude of the FID due to electronic and ring-down limitations, but the FID signal shape, especially its decay time constant $T_2^*$, correlates very well to that in the spin echoes produced by refocusing pulses (see FIG. 2). As can be observed, between refocusing pulses, the echo signals are well defined as they reach a peak at the midpoint between each pair of refocusing pulses and then decay rapidly to zero with a time constant $T_2^*$. Echo signals following the FID can be used to restore the missing part of the truncated FID signal in order to yield the initial amplitude, which corresponds to formation porosity.

Figure 3:
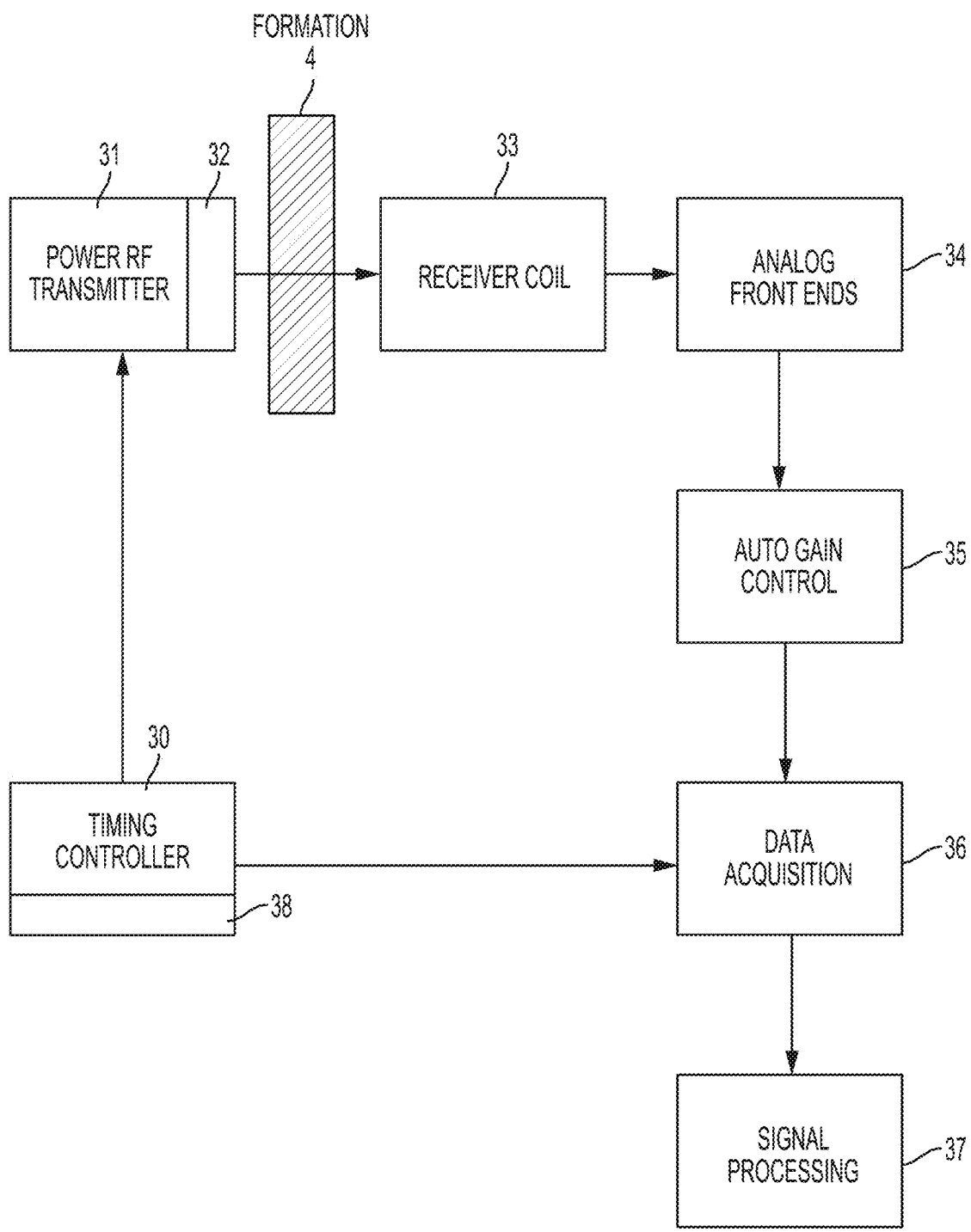
FIG. 3 depicts aspects of architecture for detection of a FID signal.

Next, an example architecture for detection of FID signals is discussed with reference to FIG. 3. A direct digital synthesizer (DDS) 38 in the timing controller 30 is used to drive a sinusoid signal with known frequency, amplitude and phase to a power RF transmitter 31 having transmitter coil 32, which sends high-power RF pulses to the earth formation 4. At the end of the excitation, NMR signals from the formation 4 are detected by a receiver coil 33. After the analog front end 34, which includes switches and amplifiers, an auto gain control unit 35 is used to adjust the signal range according to an analog-to-digital converter in data acquisition system 36. The auto gain control unit 35 is configured to increase the gain of a receiver amplifier automatically over time to compensate for decreased signal strength or amplitude over time. Decreased gain at the beginning of signal acquisition allows signal capture with a wider dynamic range and prevent saturation of the receiver amplifier. A signal processing unit 37 is configured to perform digital demodulation, decimation, and filtering to provide useable NMR data. The latency (i.e., time interval) from the end of the excitation to the digital processed signal is measured by the timing controller 30 and used in the FID analysis and reconstruction.

Figure 4:
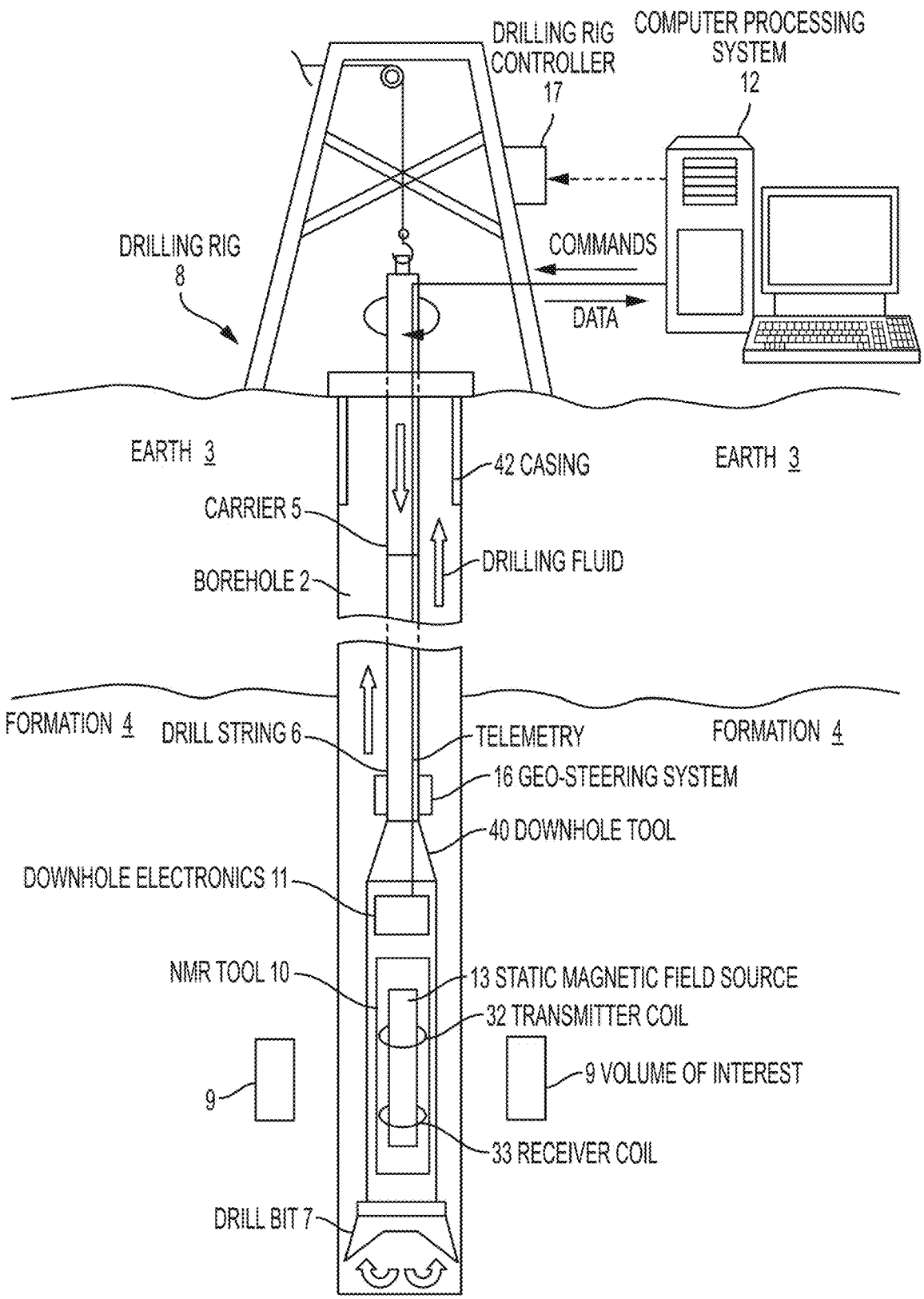
FIG. 4 illustrates a downhole NMR tool disposed in a borehole penetrating the earth.

Next, apparatus for implementing the disclosure is discussed. FIG. 4 illustrates a cross-sectional view of an embodiment of an NMR tool 10 disposed in a borehole 2 penetrating the earth 3, which includes an earth formation 4. The NMR tool 10 is conveyed through the borehole 2 by a carrier 5, which can be a drill tubular such as a drill string 6. A drill bit 7 is disposed at the distal end of the drill string 6. A drilling rig 8 is configured to conduct drilling operations such as rotating the drill string 6 and thus the drill bit 7 in order to drill the borehole 2. In addition, the drilling rig 8 is configured to pump drilling mud (i.e., drill fluid) through the drill string 6 in order to lubricate the drill bit 7 and flush cuttings from the borehole 2. Downhole electronics 11 are configured to operate the NMR tool 10, process measurement data obtained downhole, and/or act as an interface with telemetry to communicate data or commands between downhole components and a computer processing system 12 disposed at the surface of the earth 3. Non-limiting embodiments of the telemetry include pulsed-mud and wired drill pipe for real time communications. System operation and data processing operations may be performed by the downhole electronics 11, the computer processing system 12, or a combination thereof. In an alternative embodiment, the carrier 5 may be an armored wireline, which can support and convey the NMR tool 10 and also provide a conductor for communications with the surface processing system 12.

The NMR tool 10 is configured to perform multi-frequency NMR measurements on the formation 4. NMR measurements are performed in one or more volumes of interest 9. These volumes may be torus-shaped, surrounding the NMR tool 10, or, when using a side-looking NMR tool, may be directed to one side only. The NMR experiments may measure signals that are a result of the summation of individual spins at various spatial locations within the formation. The measured signals are influenced by a number of factors such as the local field homogeneity, the strength of the static and radiofrequency (RF) magnetic fields, the longitudinal relaxation time constants $T_1$ and/or a transverse relaxation time constants $T_2$ (or distributions thereof, see below), etc. $T_1$ is the time constant describing magnetic polarization of the hydrogen atoms in the volume of interest. $T_2$ represents the exponential decay time constant of spins, which is both a function of the formation fluids and the rock properties. Transverse relaxation is rapid in high-gradient, multi-frequency NMR requiring data acquisition employing a refocusing scheme (i.e. using a sequence such as CPMG) to account for the strong spin phase incoherence of the hydrogen nuclei (protons) or nuclei of interest within the formation 4 material.

In general, there is not one single value of $T_2$ for fluids contained within formation rock, but a wide distribution of values lying anywhere between fractions of a millisecond (ms) and several seconds for example. The distributions of $T_1$ and $T_2$ values may serve as primary inputs used for fluid typing, allowing the calculation of formation properties, such as porosity and permeability, or fluid properties, such as viscosity and fluid state. These formation properties may be derived as a function of depth into the formation, and together may be referred to as an NMR log.

Components in the NMR tool 10 include a static magnetic field source 13 that magnetizes formation fluids, the transmitter antennas 32, and the receiver antennas 33. The transmitter antennas (or coils) 32 transmit precisely timed bursts of radio-frequency energy to excite the spins. In a time period between these pulses, the receiver antennas (or coils) 33 receive an echo signal from those protons (or nuclei of interest) that are on-resonance with the static magnetic field produced by the magnetic field source. Because a linear relationship exists between the resonance frequency and the strength of the static magnetic field, the frequency of transmitted radio-frequency energy can be tuned to investigate volumes of interest having different diameters or depths around the NMR tool 10. It can be appreciated that the NMR tool 10 may include a variety of components and configurations as known in the art of NMR. In the embodiment of FIG. 4, the downhole electronics 11 includes the timing controller 30 including the DDS 38, the power RF transmitter 31, the analog front end 34, the auto gain control unit 35, the data acquisition system 36, and the signal processing unit 37. It can be appreciated that the NMR tool 10 may include a variety of components and configurations known in the art of NMR. Consequently, specific details of those NMR components and configurations known in the art are not discussed in further detail.

It can be appreciated that the NMR tool 10 may be calibrated to a known porosity and/or other known properties of a subsurface material by analysis or by testing in field or laboratory conditions using subsurface materials having a known porosity and/or other known properties.

The drilling rig 8 may also include a drilling rig controller 17. The drilling rig controller 17 is configured to control operations and/or operational parameters of the drilling rig 8. In one or more embodiments, the drilling rig controller 17 is configured to control a geo-steering system 16. The geo-steering system 16 is configured to geo-steer the drill string 6 in accordance with a selected geometry or trajectory using input from the drilling rig controller 17. In one or more embodiments, the borehole geometry of trajectory is selected to penetrate the formation 4 at a location having a porosity value that meets or exceeds a porosity threshold value. The borehole may be an extension of an existing borehole or a new borehole having a trajectory based on NMR data received from the NMR tool 10 disposed in another borehole.

The drilling rig 8 in FIG. 4 may also represent a completion rig configured to perform completion operations involving the borehole 2. One non-limiting example of a completion operation includes hydraulically fracturing the formation 4 to create new fractures or extend or widen existing fractures in the formation 4. The hydraulic fracturing may be performed when the estimated porosity of the formation 4 is not high enough to extract hydrocarbons economically. Another non-limiting completion operation includes perforating a casing 42 lining the borehole 2 at a depth interval having a porosity that meets or exceeds a porosity threshold value that provides for extracting hydrocarbons economically. The perforating may be conducted by a downhole tool 40 that is conveyed though the borehole 2 by a wireline. Another non-limiting completion operation includes abandoning the borehole 2 such as by plugging the borehole 2 based on a property such as porosity that indicates that hydrocarbons may not be extracted economically.

Figure 5:
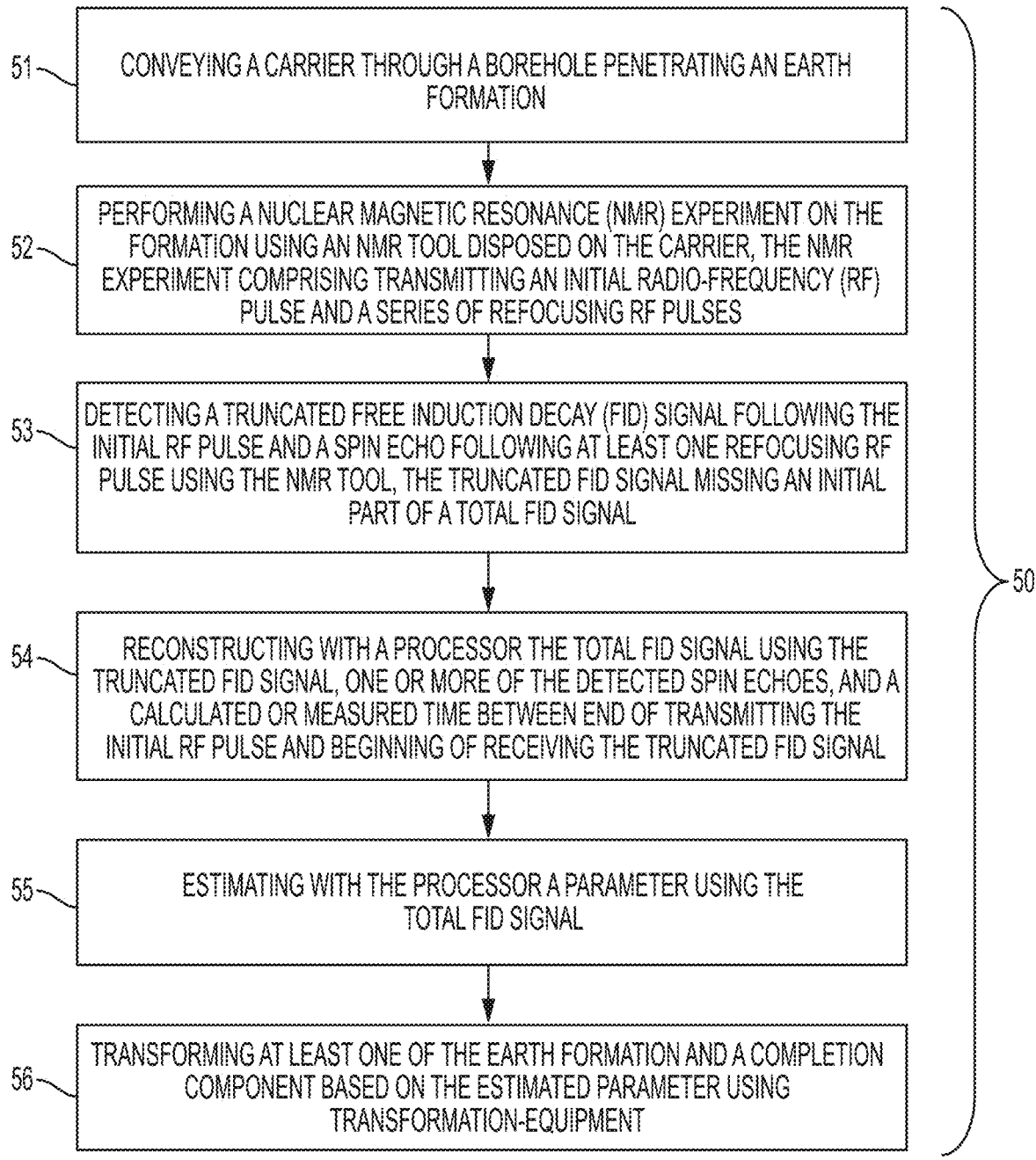
FIG. 5 is a flow chart for a method for estimating a parameter of a formation and performing an operation on the formation based on the estimated parameter.

FIG. 5 is a flow chart for a method 50 for transforming at least one of an earth formation and a completion component for the earth formation based on estimating a parameter of the earth formation. Block 51 calls for conveying a carrier through a borehole penetrating the earth formation. Block 52 calls for performing a nuclear magnetic resonance (NMR) experiment on the earth formation using an NMR tool disposed on the carrier, the NMR experiment comprising transmitting an initial radio-frequency (RF) pulse and a series of refocusing RF pulses. Block 53 calls for detecting (or receiving) a truncated free induction decay (FID) signal following the initial RF pulse and a spin echo following at least one refocusing RF pulse using the NMR tool, the truncated FID signal missing an initial part of a total FID signal.

Block 54 calls for reconstructing with a processor the total FID signal using the truncated FID signal, one or more of the detected spin echoes, and a calculated or measured time between end of transmitting the initial RF pulse and beginning of receiving the truncated FID signal. In one or more embodiments, reconstruction includes constructing a FID signal template using one or more shapes of the spin echoes. In one or more embodiments, reconstruction includes: normalizing the shapes of the spin echo shapes to provide normalized spin echo shapes; determining a representative shape of the normalized spin echo shapes; and using the representative shape as the FID signal template. In one or more embodiments, the representative shape is an average of the overlaid spin echo shapes. In one or more embodiments, normalizing includes time shifting and weighting one or more spin echoes so that the shapes of the spin echoes are overlaid upon each other and have at least one of a same maximum peak and a same energy content. In one or more embodiments, constructing the FID signal template includes using one half of a spin echo signal shape. In one or more embodiments, constructing the FID signal template includes combining symmetric first and second halves of a spin echo signal shape.

Block 55 calls for estimating with the processor the parameter using the total FID signal. In one or more embodiments, the parameter is porosity. The porosity may be determined from the maximum or peak value of the total FID signal as is known in the art.

Block 56 calls for transforming at least one of the earth formation and the completion component based on the estimated property using transformation-equipment. In one or more embodiments, transforming includes drilling a new borehole into the formation or extending an existing borehole into the formation according to a trajectory based on the estimated porosity using a drill string and a geo-steering system. In one or more embodiments, the trajectory is based on penetrating the formation at a location in the formation having the porosity exceeding a porosity threshold value. In one or more embodiments, the earth formation is transformed by being hydraulically fractured in a zone having the estimated porosity being less than a porosity threshold value. In one or more embodiments, a casing lining the borehole is transformed by perforating the casing along a depth interval having the estimated porosity exceeding a porosity threshold value using a downhole tool. In one or more embodiments, transforming includes abandoning the borehole by plugging that borehole based upon the estimated porosity being less than a porosity threshold value.

The method 50 may also include: performing a cross-correlation of the representative shape with respect to each of the spin echo shapes to provide cross-correlation values; and using the representative shape as the FID signal template in response to the cross-correlation values exceeding a threshold cross-correlation value (i.e., where higher values indicate more accurate representation of the spin-echo shapes).

The method 50 may also include transmitting the initial RF pulse and the series of refocusing RF pulses using one or more transmitter antennas and receiving the truncated FID signal and the spin echoes using one or more receiver antennas that are the same or different from the one or more transmitter antennas.

The method 50 may also include synchronizing a time at which the initial RF pulse and the series of refocusing RF pulses are transmitted with a time the truncated FID signal and the spin echoes are received.

The method 50 may also include providing automatic gain control to the received truncated FID signal and the received spin echoes, wherein automatic gain control comprises automatically increasing gain of received NMR signals over time to compensate for a decrease in received signal strength over time.

The method 50 may also include filtering the received NMR signals (i.e., the truncated FID signal and the spin echoes) using a narrow band filter configured to discriminate the received NMR signals from the transmitted RF pulses.

The methods and apparatuses disclosed herein provide several advantages. One advantage is that the methods and apparatuses can be used to estimate a formation property such as porosity with increased accuracy over conventional NMR methods and apparatuses. Another advantage is that hydrocarbon exploration and production resources can be used more efficiently based on the increased accuracy of the estimated formation property. For example, exploration and production resources can be directed to locations in the formation having high levels of porosity and thus high levels of hydrocarbon reservoirs to increase the return on investment.

Set forth below are some embodiments of the foregoing disclosure:

Embodiment 1

A method for transforming at least one of an earth formation and a completion component for the earth formation based on estimating a parameter of the earth formation, the method comprising: conveying a carrier through a borehole penetrating the earth formation; performing a nuclear magnetic resonance (NMR) experiment on the earth formation using an NMR tool disposed on the carrier, the NMR experiment comprising transmitting an initial radio-frequency (RF) pulse and a series of refocusing RF pulses; detecting a truncated free induction decay (FID) signal following the initial RF pulse and a spin echo following at least one refocusing RF pulse using the NMR tool, the truncated FID signal missing an initial part of a total FID signal; reconstructing with a processor the total FID signal using the truncated FID signal, one or more of the detected spin echoes, and a calculated or measured time between end of transmitting the initial RF pulse and beginning of receiving the truncated FID signal; estimating with the processor the parameter using the total FID signal; and transforming at least one of the earth formation and the completion component based on the estimated parameter using transformation-equipment.

Embodiment 2

The method according to any prior embodiment, wherein the parameter comprises porosity.

Embodiment 3

The method according to any prior embodiment, wherein the earth formation is transformed by drilling a new borehole into the earth formation or extending an existing borehole into the earth formation according to a trajectory based on the estimated porosity exceeding a porosity threshold value, the transformation equipment comprising a drill string and a geo-steering system.

Embodiment 4

The method according to any prior embodiment, wherein the trajectory comprises a horizontal section that penetrates a region of the earth formation having the estimated porosity exceeding the porosity threshold value.

Embodiment 5

The method according to any prior embodiment, wherein the earth formation is transformed by being hydraulically fractured in a zone having the estimated porosity being less than a porosity threshold value.

Embodiment 6

The method according to any prior embodiment, wherein the completion component comprises a casing and the casing is transformed by perforating the casing along a depth interval having the estimated porosity exceeding a porosity threshold value using a downhole tool.

Embodiment 7

The method according to any prior embodiment, wherein transforming comprises abandoning the borehole by plugging that borehole based upon the estimated porosity being less than a porosity threshold value.

Embodiment 8

The method according to any prior embodiment, wherein reconstructing comprises constructing a FID signal template using one or more shapes of the spin echoes.

Embodiment 9

The method according to any prior embodiment, further comprising: normalizing the shapes of the spin echo shapes to provide normalized spin echo shapes; determining a representative shape of the normalized spin echo shapes; and using the representative shape as the FID signal template.

Embodiment 10

The method according to any prior embodiment, wherein the representative shape is an average of the overlaid spin echo shapes.

Embodiment 11

The method according to any prior embodiment, wherein normalizing comprises time shifting and weighting one or more spin echoes so that the shapes of the spin echoes are overlaid upon each other and have at least one of a same maximum peak and a same energy content.

Embodiment 12

The method according to any prior embodiment, further comprising: performing a cross-correlation of the representative shape with respect to each of the spin echo shapes to provide cross-correlation values; and using the representative shape as the FID signal template in response to the cross-correlation values exceeding a threshold cross-correlation value.

Embodiment 13

The method according to any prior embodiment, wherein constructing the FID signal template comprises using one half of a spin echo signal shape.

Embodiment 14

The method according to any prior embodiment, wherein constructing the FID signal template comprises combining symmetric first and second halves of a spin echo signal shape.

Embodiment 15

The method according to any prior embodiment, further comprising transmitting the initial RF pulse and the series of refocusing RF pulses using one or more transmitter antennas.

Embodiment 16

The method according to any prior embodiment, further comprising receiving the truncated FID signal and the spin echoes using one or more receiver antennas that are different from the transmitter antennas.

Embodiment 17

The method according to any prior embodiment, further comprising receiving the truncated FID signal and the spin echoes using one or more receiver antennas that are the same as the transmitter antennas.

Embodiment 18

The method according to claim 1, further comprising synchronizing a time at which the initial RF pulse and the series of refocusing RF pulses are transmitted with a time the truncated FID signal and the spin echoes are detected.

Embodiment 19

The method according to any prior embodiment, further comprising providing automatic gain control to the received truncated FID signal and the received spin echoes, wherein automatic gain control comprises automatically increasing gain of received NMR signals over time to compensate for a decrease in received signal strength over time.

Embodiment 20

An apparatus for transforming at least one of an earth formation and a completion component for the earth formation based on estimating a parameter of the earth formation, the apparatus comprising: a nuclear magnetic resonance (NMR) tool configured to perform an NMR experiment on the formation, the NMR experiment comprising (a) transmitting an initial radio-frequency (RF) pulse and a series of refocusing RF pulses and (b) detecting a truncated free induction decay (FID) signal following the initial RF pulse and one or more spin echoes following at least one refocusing RF pulse, the truncated FID signal missing an initial part of a total FID signal; a processor configured to reconstruct the total FID signal using the truncated FID signal, one or more of the detected spin echoes, and a measured or estimated time between end of transmitting the initial RF pulse and beginning of receiving the truncated FID signal and to estimate the parameter using the total FID signal; and transformation-equipment configured to transform at least one of the earth formation and the completion component for the earth formation based on the estimated parameter.

Embodiment 21

The apparatus according to any prior embodiment, wherein the NMR tool comprises one or more transmitter antennas configured to transmit the initial RF pulse and the series of refocusing RF pulses and one or more receiver antennas configured to receive the truncated FID signal and the one or more spin echoes following the at least one refocusing RF pulse, the one or more receiver antennas being different from the one or more transmitter antennas.

Embodiment 22

The apparatus according to any prior embodiment, wherein the NMR tool comprises one or more transmitter antennas configured to transmit the initial RF pulse and the series of refocusing RF pulses and one or more receiver antennas configured to receive the truncated FID signal and the one or more spin echoes following the at least one refocusing RF pulse, the one or more receiver antennas being the same as the one or more transmitter antennas.

Embodiment 23

The apparatus according to any prior embodiment, further comprising a timing synchronizer configured to synchronize a time at which the initial RF pulse and the series of refocusing RF pulses are transmitted with a time the truncated FID signal and the spin echoes are received.

Embodiment 24

The apparatus according to any prior embodiment, further comprising an automatic gain control circuit configured to provide automatic gain control to the received truncated FID signal and the received spin echoes, wherein automatic gain control comprises automatically increasing gain of received NMR signals over time to compensate for a decrease in received signal strength over time.

Embodiment 25

The apparatus according to any prior embodiment, further comprising a narrow-band filter configured to filter received NMR signals to discriminate the received NMR signals from transmitted RF pulses.

Embodiment 26

The apparatus according to any prior embodiment, wherein the NMR tool is disposed on a carrier configured to be conveyed through a borehole penetrating the formation.

In support of the teachings herein, various analysis components may be used, including a digital and/or an analog system. For example, the downhole electronics 11, the surface computer processing system 12, the drilling rig controller 17, and/or the geo-steering system 16 may include digital and/or analog systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing aspects of the teachings herein. For example, a power supply (e.g., at least one of a generator, a remote supply and a battery, magnet, electromagnet, sensor, electrode, transmitter, receiver, transceiver, antenna, controller, optical unit, electrical unit or electromechanical unit may be included in support of the various aspects discussed herein or in support of other functions beyond this disclosure.

The term "carrier" as used herein means any device, device component, combination of devices, media and/or member that may be used to convey, house, support or otherwise facilitate the use of another device, device component, combination of devices, media and/or member. Other exemplary non-limiting carriers include drill strings of the coiled tube type, of the jointed pipe type and any combination or portion thereof. Other carrier examples include casing pipes, wirelines, wireline sondes, slickline sondes, drop shots, bottom-hole-assemblies, drill string inserts, modules, internal housings and substrate portions thereof.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates to one or more structural limitations of a device that are required for the device to perform the function or operation for which the device is configured.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A method for transforming at least one of an earth formation and a completion component for the earth formation based on estimating a parameter of the earth formation, the method comprising:

conveying a carrier through a borehole penetrating the earth formation;

performing a nuclear magnetic resonance (NMR) experiment on the earth formation using an NMR tool disposed on the carrier, the NMR experiment comprising transmitting an initial radio-frequency (RF) pulse and a series of refocusing RF pulses;

detecting a truncated free induction decay (FID) signal following the initial RF pulse and a spin echo following at least one refocusing RF pulse using the NMR tool, the truncated FID signal missing an initial part of a total FID signal;

reconstructing with a processor the total FID signal using the truncated FID signal, one or more of the detected spin echoes, and a calculated or measured time between end of transmitting the initial RF pulse and beginning of receiving the truncated FID signal, wherein reconstructing comprises: constructing a FID signal template using one or more shapes of the spin echoes; normalizing the shapes of the spin echo shapes by time shifting and weighting one or more spin echoes so that the shapes of the spin echoes are overlaid upon each other and have at least one of a same maximum peak and a same energy content to provide normalized spin echo shapes; determining a representative shape of the normalized spin echo shapes; and using the representative shape as the FID signal template;

estimating with the processor the parameter using the total FID signal; and transforming at least one of the earth formation and the completion component based on the estimated parameter using transformation-equipment.

2. The method according to claim 1, wherein the parameter comprises porosity.

3. The method according to claim 2, wherein the earth formation is transformed by drilling a new borehole into the earth formation or extending an existing borehole into the earth formation according to a trajectory based on the estimated porosity exceeding a porosity threshold value, the transformation equipment comprising a drill string and a geo-steering system.

4. The method according to claim 3, wherein the trajectory comprises a horizontal section that penetrates a region of the earth formation having the estimated porosity exceeding the porosity threshold value.

5. The method according to claim 2, wherein the earth formation is transformed by being hydraulically fractured in a zone having the estimated porosity being less than a porosity threshold value.

6. The method according to claim 2, wherein the completion component comprises a casing and the casing is transformed by perforating the casing along a depth interval having the estimated porosity exceeding a porosity threshold value using a downhole tool.

7. The method according to claim 2, wherein transforming comprises abandoning the borehole by plugging that borehole based upon the estimated porosity being less than a porosity threshold value.

8. A method for transforming at least one of an earth formation and a completion component for the earth formation based on estimating a parameter of the earth formation, the method comprising:

conveying a carrier through a borehole penetrating the earth formation;

performing a nuclear magnetic resonance (NMR) experiment on the earth formation using an NMR tool disposed on the carrier, the NMR experiment comprising transmitting an initial radio-frequency (RF) pulse and a series of refocusing RF pulses;

detecting a truncated free induction decay (FID) signal following the initial RF pulse and a spin echo following at least one refocusing RF pulse using the NMR tool, the truncated FID signal missing an initial part of a total FID signal;

reconstructing with a processor the total FID signal using the truncated FID signal, one or more of the detected spin echoes, and a calculated or measured time between end of transmitting the initial RF pulse and beginning of receiving the truncated FID signal, wherein reconstructing comprises: constructing a FID signal template using one or more shapes of the spin echoes; normalizing the shapes of the spin echo shapes to provide normalized spin echo shapes; determining a representative shape of the normalized spin echo shapes that is an average of overlaid spin echo shapes; and using the representative shape as the FID signal template;

estimating with the processor the parameter using the total FID signal; and transforming at least one of the earth formation and the completion component based on the estimated parameter using transformation-equipment.

9. The method according to claim 1, further comprising:

performing a cross-correlation of the representative shape with respect to each of the spin echo shapes to provide cross-correlation values; and using the representative shape as the FID signal template in response to the cross-correlation values exceeding a threshold cross-correlation value.

10. The method according to claim 1, wherein constructing the FID signal template comprises using one half of a spin echo signal shape.

11. The method according to claim 1, wherein constructing the FID signal template comprises combining symmetric first and second halves of a spin echo signal shape.

12. The method according to claim 1, further comprising transmitting the initial RF pulse and the series of refocusing RF pulses using one or more transmitter antennas.

13. The method according to claim 12, further comprising receiving the truncated FID signal and the spin echoes using one or more receiver antennas that are different from the transmitter antennas.

14. The method according to claim 12, further comprising receiving the truncated FID signal and the spin echoes using one or more receiver antennas that are the same as the transmitter antennas.

15. The method according to claim 1, further comprising synchronizing a time at which the initial RF pulse and the series of refocusing RF pulses are transmitted with a time the truncated FID signal and the spin echoes are detected.

16. The method according to claim 1, further comprising providing automatic gain control to the received truncated FID signal and the received spin echoes, wherein automatic gain control comprises automatically increasing gain of received NMR signals over time to compensate for a decrease in received signal strength over time.

17. An apparatus for transforming at least one of an earth formation and a completion component for the earth formation based on estimating a parameter of the earth formation, the apparatus comprising:

a nuclear magnetic resonance (NMR) tool configured to perform an NMR experiment on the formation, the NMR experiment comprising (a) transmitting an initial radio-frequency (RF) pulse and a series of refocusing RF pulses and (b) detecting a truncated free induction decay (FID) signal following the initial RF pulse and one or more spin echoes following at least one refocusing RF pulse, the truncated FID signal missing an initial part of a total FID signal;

a processor configured to: reconstruct the total FID signal using the truncated FID signal, one or more of the detected spin echoes, and a measured or estimated time between end of transmitting the initial RF pulse and beginning of receiving the truncated FID signal, wherein to reconstruct comprises: constructing a FID signal template using one or more shapes of the spin echoes; normalizing the shapes of the spin echo shapes by time shifting and weighting one or more spin echoes so that the shapes of the spin echoes are overlaid upon each other and have at least one of a same maximum peak and a same energy content to provide normalized spin echo shapes; determining a representative shape of the normalized spin echo shapes; and using the representative shape as the FID signal template; and estimate the parameter using the total FID signal; and transformation-equipment configured to transform at least one of the earth formation and the completion component for the earth formation based on the estimated parameter.

18. The apparatus according to claim 17, wherein the NMR tool comprises one or more transmitter antennas configured to transmit the initial RF pulse and the series of refocusing RF pulses and one or more receiver antennas configured to receive the truncated FID signal and the one or more spin echoes following the at least one refocusing RF pulse, the one or more receiver antennas being different from the one or more transmitter antennas.

19. The apparatus according to claim 17, wherein the NMR tool comprises one or more transmitter antennas configured to transmit the initial RF pulse and the series of refocusing RF pulses and one or more receiver antennas configured to receive the truncated FID signal and the one or more spin echoes following the at least one refocusing RF pulse, the one or more receiver antennas being the same as the one or more transmitter antennas.

20. The apparatus according to claim 17, further comprising a timing synchronizer configured to synchronize a time at which the initial RF pulse and the series of refocusing RF pulses are transmitted with a time the truncated FID signal and the spin echoes are received.

21. The apparatus according to claim 17, further comprising an automatic gain control circuit configured to provide automatic gain control to the received truncated FID signal and the received spin echoes, wherein automatic gain control comprises automatically increasing gain of received NMR signals over time to compensate for a decrease in received signal strength over time.

22. The apparatus according to claim 17, further comprising a narrow-band filter configured to filter received NMR signals to discriminate the received NMR signals from transmitted RF pulses.

23. The apparatus according to claim 17, wherein the NMR tool is disposed on a carrier configured to be conveyed through a borehole penetrating the formation.

\* \* \* \* \*